US012733292B2

(12) United States Patent
Tsukuda

(10) Patent No.: US 12,733,292 B2
(45) Date of Patent: Sep. 8, 2026

(54) PHOTODETECTION CIRCUIT AND DISTANCE MEASURING DEVICE

(71) Applicant: SONY SEMICONDUCTOR SOLUTIONS CORPORATION, Kanagawa (JP)

(72) Inventor: Yasunori Tsukuda, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 922 days.

(21) Appl. No.: 18/000,809

(22) PCT Filed: May 14, 2021

(86) PCT No.: PCT/JP2021/018346
§ 371 (c)(1),
(2) Date: Dec. 5, 2022

(87) PCT Pub. No.: WO2021/251057
PCT Pub. Date: Dec. 16, 2021

(65) Prior Publication Data

US 2023/0231060 A1 Jul. 20, 2023

(30) Foreign Application Priority Data

Jun. 12, 2020 (JP) ................................ 2020-102438

(51) Int. Cl.
*G01C 3/08* (2006.01)
*G01J 1/44* (2006.01)
(Continued)

(52) U.S. Cl.
CPC .............. *H10F 77/959* (2025.01); *G01J 1/44* (2013.01); *H10F 30/225* (2025.01); *G01J 2001/4466* (2013.01); *G01S 17/08* (2013.01)

(58) Field of Classification Search
CPC ........ H01F 77/959; H01F 30/225; G01J 1/44; G01J 2001/4466; G01S 17/08
See application file for complete search history.

(56) References Cited

U.S. PATENT DOCUMENTS

2008/0017785 A1 1/2008 Byren
2016/0163886 A1 6/2016 Wang
(Continued)

FOREIGN PATENT DOCUMENTS

CN 104677511 A 6/2015
CN 109581333 A 4/2019
(Continued)

OTHER PUBLICATIONS

Richardson, Justin; Henderson, Robert K.; Renshaw, David "Dynamic Quenching for Single Photon Avalanche Diode Arrays" 2007 International Image Sensor Workshop 2007 pp. 258-26.
(Continued)

*Primary Examiner* — Mark Hellner
(74) *Attorney, Agent, or Firm* — CHIP LAW GROUP

(57) ABSTRACT

There is provided a photodetection circuit and a distance measuring device. The photodetection circuit includes an avalanche photodiode, a charging circuit that supplies a voltage to the avalanche photodiode, and an input amplifier including a comparison circuit in which a voltage level of an output terminal changes according to a comparison result between a voltage of an input terminal connected to the avalanche photodiode and a reference voltage, and a voltage control circuit that changes a potential of the reference voltage. The photodetection circuit additionally includes a state detecting circuit that sets timing for causing the voltage control circuit to change the potential of the reference voltage on the basis of a detection result of the voltage level.

13 Claims, 13 Drawing Sheets

(51) Int. Cl.

| | |
|---|---|
| ***H10F 30/225*** | (2025.01) |
| ***H10F 77/00*** | (2025.01) |
| *G01S 17/08* | (2006.01) |

(56) References Cited

U.S. PATENT DOCUMENTS

| | | | | |
|---|---|---|---|---|
| 2018/0259625 | A1* | 9/2018 | Gnecchi | G01S 7/4873 |
| 2019/0326450 | A1* | 10/2019 | Iwata | H04N 25/773 |
| 2021/0018624 | A1 | 1/2021 | Tachino | |
| 2023/0061653 | A1* | 3/2023 | Zhu | G01S 7/4861 |

FOREIGN PATENT DOCUMENTS

| | | | |
|---|---|---|---|
| CN | 111121986 | A | 5/2020 |
| CN | 113534107 | A | 10/2021 |
| EP | 2787368 | B1 | 2/2020 |
| JP | 2014-081254 | A | 5/2014 |
| JP | 2020-017861 | A | 1/2020 |
| JP | 2020034523 | A | 3/2020 |
| JP | 2020094849 | A | 6/2020 |
| JP | 2021001763 | A | 1/2021 |
| WO | 2018/181979 | A1 | 10/2018 |
| WO | WO-2018191497 | A2 | 10/2018 |
| WO | 2019/087783 | A1 | 5/2019 |
| WO | 2019/194039 | A1 | 10/2019 |
| WO | 2020/121736 | A1 | 6/2020 |

OTHER PUBLICATIONS

International Search Report and Written Opinion of PCT Application No. PCT/JP2021/018346, issued on Jul. 27, 2021, 11 pages of ISRWO.

* cited by examiner

101
IMAGING SYSTEM
111
ILLUMINATION DEVICE
121
ILLUMINATION CONTROL SECTION
122
112
IMAGING DEVICE
131
DISTANCE MEASURING DEVICE
141
142
PHOTODETECTION CIRCUIT
143
SIGNAL PROCESSING CIRCUIT
132
CONTROL SECTION
133
DISPLAY SECTION
134
STORAGE SECTION
102
103

143
SIGNAL PROCESSING CIRCUIT
TDC
200
HISTOGRAM CREATING SECTION
201
DISTANCE DETERMINING SECTION
202
142
PHOTODETECTION CIRCUIT
151
VRL
Vc
152
CHARGING CIRCUIT
153
156
APDEN
154
INPUT AMPLIFIER
Vs
Vo
155
STATE DETECTING CIRCUIT

FIG. 7
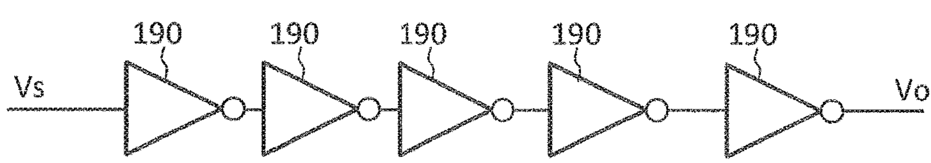
FIG. 8
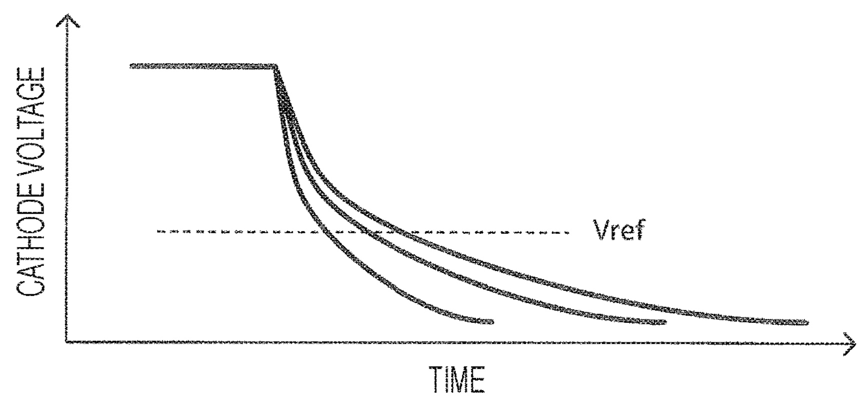
FIG. 9
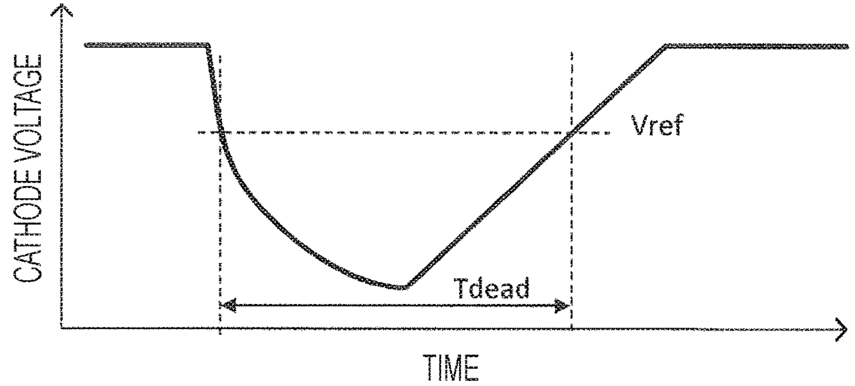

143
SIGNAL PROCESSING CIRCUIT
TDC
200
HISTOGRAM CREATING SECTION
201
DISTANCE DETERMINING SECTION
202
144
PHOTODETECTION CIRCUIT
VDDC
151
Va
152
CHARGING CIRCUIT
156
153
APDEN
154
INPUT AMPLIFIER
Vo
Vs
155
STATE DETECTING CIRCUIT

Figure 14:
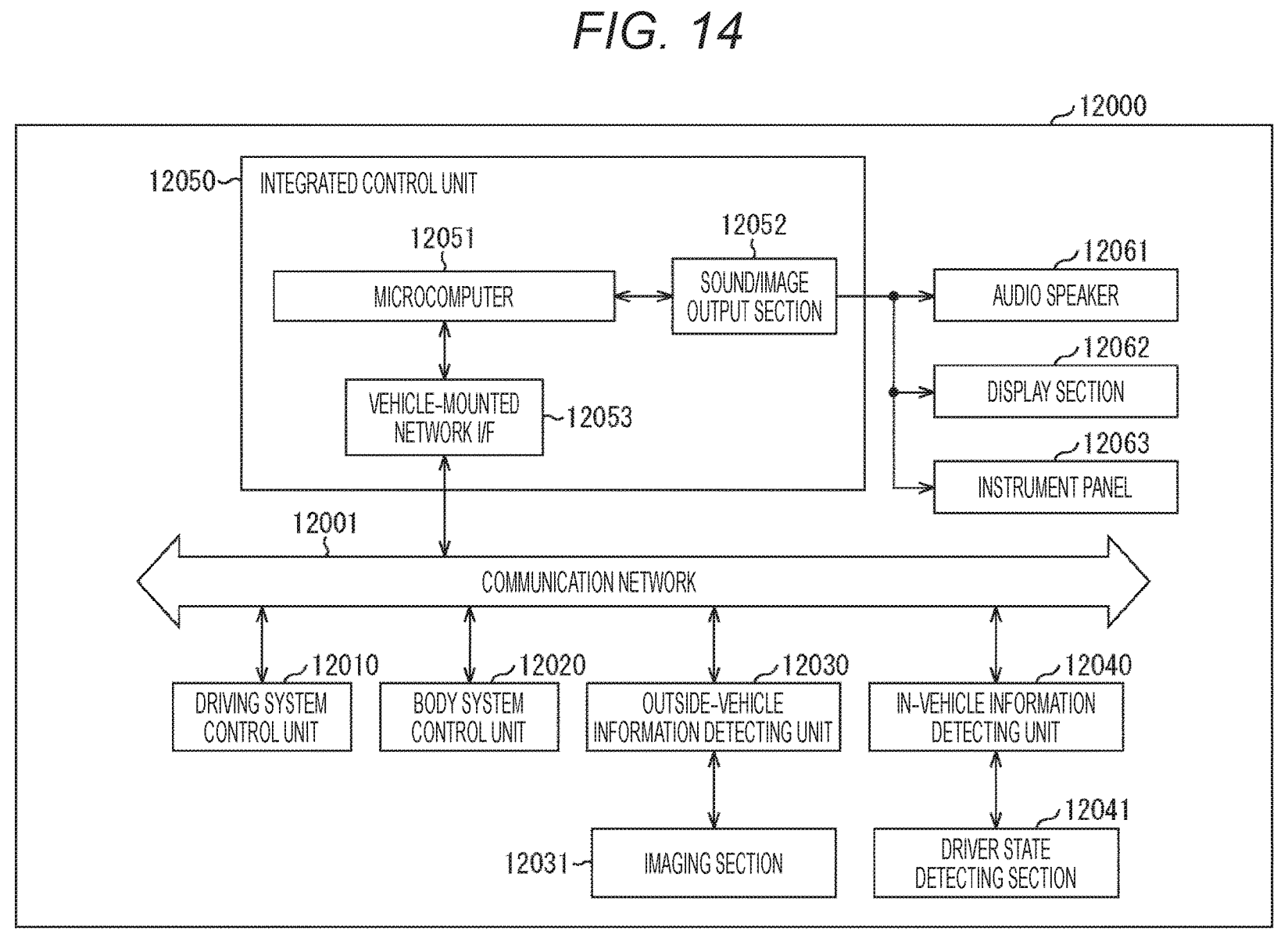

12050 INTEGRATED CONTROL UNIT

12051 MICROCOMPUTER

12052 SOUND/IMAGE OUTPUT SECTION

12053 VEHICLE-MOUNTED NETWORK I/F

12061 AUDIO SPEAKER

12062 DISPLAY SECTION

12063 INSTRUMENT PANEL

12001 COMMUNICATION NETWORK

12010 DRIVING SYSTEM CONTROL UNIT

12020 BODY SYSTEM CONTROL UNIT

12030 OUTSIDE-VEHICLE INFORMATION DETECTING UNIT

12040 IN-VEHICLE INFORMATION DETECTING UNIT

12031 IMAGING SECTION

12041 DRIVER STATE DETECTING SECTION

PHOTODETECTION CIRCUIT AND DISTANCE MEASURING DEVICE

CROSS REFERENCE TO RELATED APPLICATIONS

This application is a U.S. National Phase of International Patent Application No. PCT/JP2021/018346 filed on May 14, 2021, which claims priority benefit of Japanese Patent Application No. JP 2020-102438 filed in the Japan Patent Office on Jun. 12, 2020. Each of the above-referenced applications is hereby incorporated herein by reference in its entirety.

TECHNICAL FIELD

The present disclosure relates to a photodetection circuit and a distance measuring device.

BACKGROUND ART

As a method of measuring the distance to a subject, a time of flight (ToF) method is used. In the ToF method, reflected light obtained by light emitted from a light source being reflected by a subject is detected. Subsequently, the distance to the subject is measured on the basis of the time from the emission of the light to the detection of the reflected light.

A distance measuring device using the ToF method is generally provided with a photodetection circuit that detects the reflected light described above. In the photodetection circuit, a voltage change of a photodetection element obtained when photons are incident is detected. A reference voltage for detecting this voltage change is generally fixed.

CITATION LIST

Patent Document

Patent Document 1: Japanese Patent Application Laid-Open No. 2014-81254

SUMMARY OF THE INVENTION

Problems to be Solved by the Invention

If the reference voltage described above is low, a distance measurement error increases due to characteristic variation of the photodetection element in some cases. In order to reduce this distance measurement error, it is desirable that the reference voltage be high.

However, if the reference voltage is high, the dead time, which is a period during which photons cannot be detected, becomes long, and the distance measurement accuracy deteriorates in some cases.

The present disclosure provides a photodetection circuit and a distance measuring device capable of improving distance measuring performance.

Solutions to Problems

A photodetection circuit according to an embodiment of the present disclosure includes: an avalanche photodiode; a charging circuit that supplies a voltage to the avalanche photodiode; an input amplifier including a comparison circuit in which a voltage level of an output terminal changes according to a comparison result between a voltage of an input terminal connected to the avalanche photodiode and a reference voltage, and a voltage control circuit that changes a potential of the reference voltage; and a state detecting circuit that sets timing for causing the voltage control circuit to change the potential of the reference voltage on the basis of a detection result of the voltage level.

Furthermore, the comparison circuit may include an inverter circuit, and the voltage control circuit may include a switching element that is connected to the inverter circuit and performs switching according to an output voltage of the state detecting circuit, and a resistive element or a current source that is connected in parallel with the switching element.

Furthermore, the comparison circuit may include an operational amplifier circuit, and the voltage control circuit may include a switch circuit that switches the reference voltage to a first reference voltage or a second reference voltage different from the first reference voltage according to an output voltage of the state detecting circuit.

Furthermore, the comparison circuit may include an inverter circuit, and the voltage control circuit may include a current source that is connected to the inverter circuit and whose output current value changes according to an output voltage of the state detecting circuit.

Furthermore, the state detecting circuit may include inverter elements of odd-numbered stages connected in series with one another.

Furthermore, the input amplifier may include a first input amplifier that outputs the comparison result to a signal processing circuit, and a second input amplifier that outputs the comparison result to the state detecting circuit.

Furthermore, circuit configuration of the first input amplifier may be the same as circuit configuration of the second input amplifier.

Furthermore, circuit configuration of the first input amplifier may be different from circuit configuration of the second input amplifier.

Furthermore, the avalanche photodiode, the charging circuit, the input amplifier, and the state detecting circuit may be provided on one semiconductor substrate.

Furthermore, the avalanche photodiode may be provided on a first semiconductor substrate, and the charging circuit, the input amplifier, and the state detecting circuit may be provided on a second semiconductor substrate bonded to the first semiconductor substrate.

Furthermore, a quench circuit that is connected to the avalanche photodiode and the input terminal of the input amplifier and controls a potential of the input terminal may be further included.

Furthermore, a cathode of the avalanche photodiode may be connected to the input terminal of the input amplifier.

Furthermore, an anode of the avalanche photodiode may be connected to the input terminal of the input amplifier.

A distance measuring device according to an embodiment of the present disclosure includes any one of the above-described photodetection circuits and a signal processing circuit that processes an output signal of the photodetection circuit.

The signal processing circuit may include:

- a time to digital converter (TDC) that converts the output signal into a digital value; and
- a histogram creating circuit that counts the number of times the digital value is acquired; and
- a distance determining section that determines a distance from the photodetection circuit to a subject on the basis of a count result of the histogram creating circuit.

BRIEF DESCRIPTION OF DRAWINGS

FIG. 7 is a circuit diagram depicting configuration of a state detecting circuit.

FIG. 8 is a graph depicting an example of voltage characteristics of a plurality of photodetection elements.

FIG. 9 is a graph depicting an example of voltage characteristics of a single photodetection element.

FIG. 14 is a block diagram depicting an example of schematic configuration of a vehicle control system.

MODE FOR CARRYING OUT THE INVENTION

First Embodiment

Figure 1:
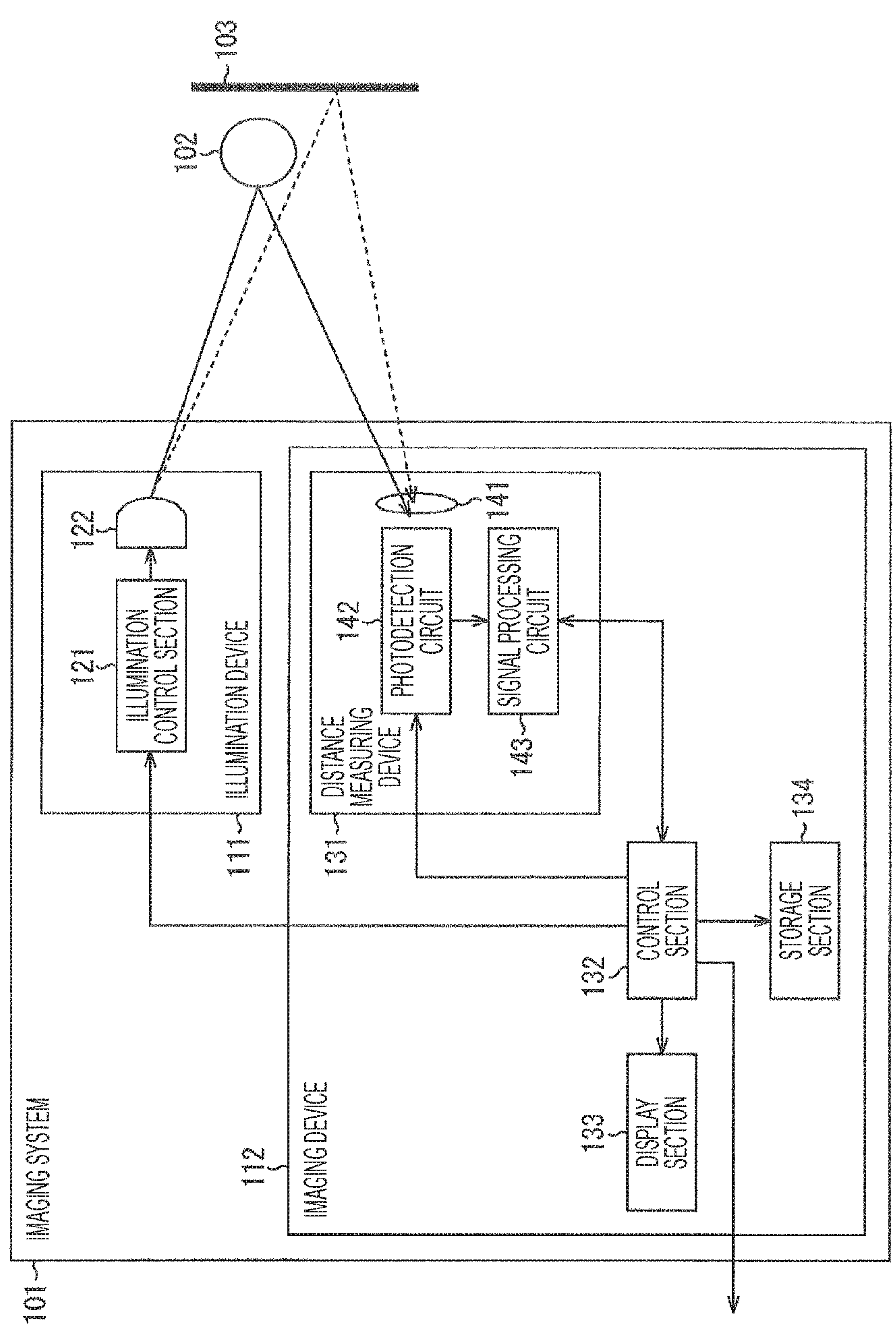
FIG. 1 is a block diagram depicting a configuration example of an imaging system using a photodetection circuit and a distance measuring device according to a first embodiment.

FIG. 1 is a block diagram depicting a configuration example of an imaging system using a photodetection circuit and a distance measuring device according to a first embodiment. An imaging system 101 depicted in FIG. 1 is a system that captures a distance image using the ToF method, and includes an illumination device 111 and an imaging device 112.

The illumination device 111 includes an illumination control section 121 and a light source 122. The illumination control section 121 controls a pattern in which the light source 122 emits irradiation light on the basis of control of the control section 132 of the imaging device 112. Specifically, the illumination control section 121 controls the pattern in which the light source 122 emits irradiation light according to the irradiation code included in the irradiation signal supplied from the control section 132. For example, the irradiation code includes two values of "1" (High) and "0" (Low). The illumination control section 121 turns on the light source 122 when the value of the irradiation code is "1", and turns off the light source 122 when the value of the irradiation code is "0".

The light source 122 emits light (irradiation light) in a predetermined wavelength range on the basis of control of the illumination control section 121. The light source 122 is, for example, an infrared laser diode. The type of the light source 122 and the wavelength range of the irradiation light can be arbitrarily set according to the application of the imaging system 101 or the like.

The imaging device 112 receives reflected light obtained by irradiation light being reflected by a subject 102 and a subject 103. The imaging device 112 includes a distance measuring device 131, the control section 132, a display section 133, and a storage section 134.

The distance measuring device 131 includes a lens 141, a photodetection circuit 142, and a signal processing circuit 143. The lens 141 forms an image of the incident light on the photodetection circuit 142. Incidentally, the lens 141 has any configuration, and for example, the lens 141 can include a plurality of lens groups.

The photodetection circuit 142 images the subject 102, the subject 103, and the like on the basis of control of the control section 132. Furthermore, the photodetection circuit 142 outputs a signal obtained by imaging to the signal processing circuit 143.

The signal processing circuit 143 processes the output signal of the photodetection circuit 142 on the basis of control of the control section 132. For example, the signal processing circuit 143 detects the distance to the subject on the basis of the output signal of the photodetection circuit 142 and creates a distance image indicating the distance to the subject.

The control section 132 includes, for example, a control circuit such as a field programmable gate array (FPGA) or a digital signal processor (DSP), a processor, or the like. The control section 132 controls the illumination control section 121, the photodetection circuit 142, and the signal processing circuit 143.

The display section 133 includes, for example, a panel type display device such as a liquid crystal display device or an organic electro luminescence (EL) display device.

The storage section 134 can include any storage device, storage medium, or the like, and stores a distance image or the like.

Figure 2:
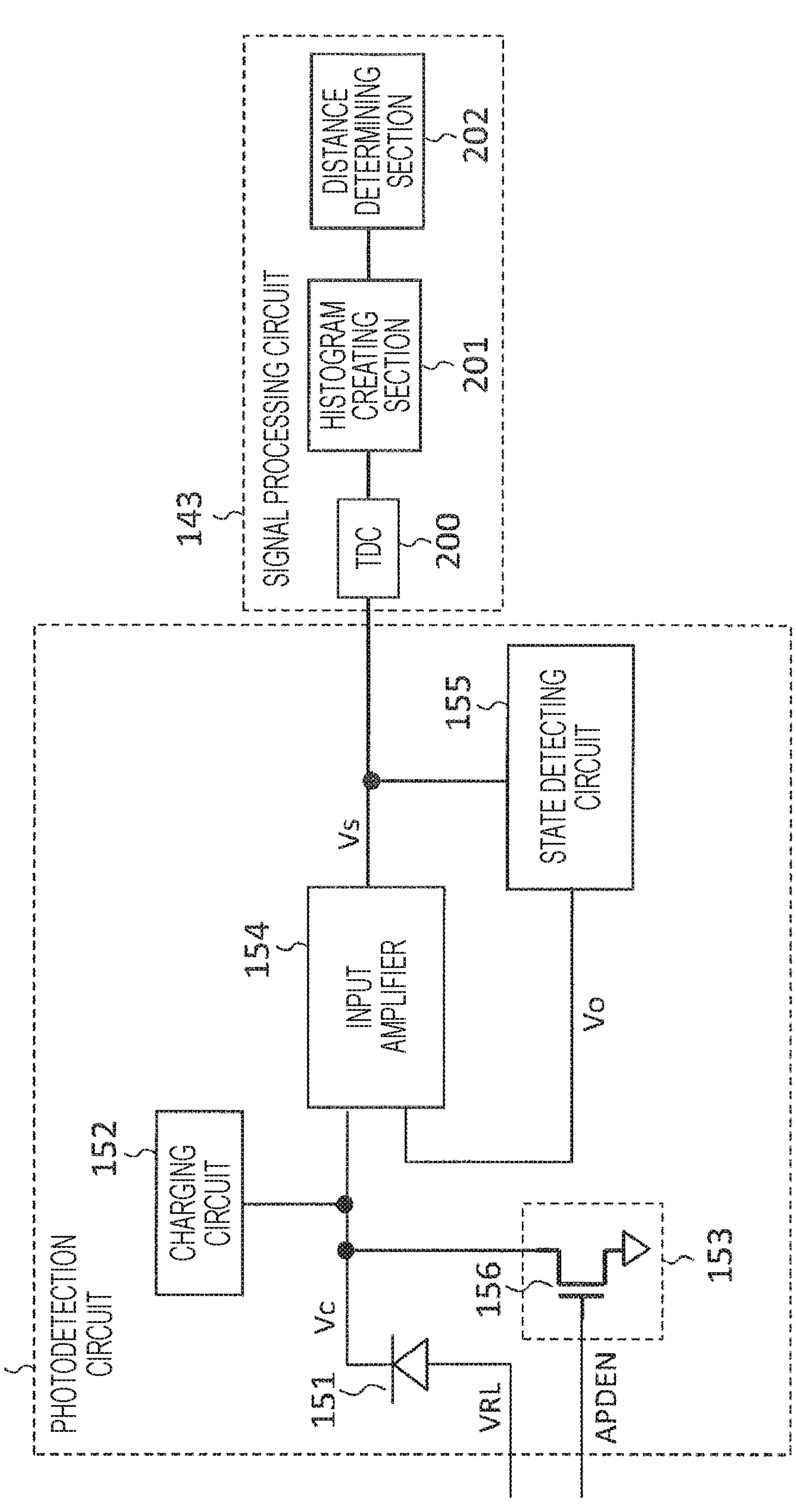
FIG. 2 is a block diagram depicting a configuration example of the photodetection circuit and the signal processing circuit.

FIG. 2 is a block diagram depicting a configuration example of the photodetection circuit 142 and the signal processing circuit 143.

The photodetection circuit 142 includes a photodetection element 151, a charging circuit 152, a quench circuit 153, an input amplifier 154, and a state detecting circuit 155. These are provided on one semiconductor substrate. Incidentally, since the photodetection circuit 142 depicted in FIG. 2 is a unit circuit corresponding to one pixel, the distance measuring device 131 includes a plurality of photodetection circuits 142 according to the number of pixels.

The photodetection element 151 is a photodiode a typical example of which is an avalanche photo diode (APD), a single photon avalanche diode (SPAD), or the like. The cathode of the photodetection element 151 is connected to the charging circuit 152 and an input terminal of the input amplifier 154. The anode of the photodetection element 151 is set to a negative voltage VRL by a negative power supply (not illustrated).

The charging circuit 152 includes, for example, a current source and a resistive element connected in series with each other. The charging circuit 152 supplies a positive voltage to the cathode of the photodetection element 151. As a result, if a reverse voltage equal to or higher than the breakdown voltage is applied between the anode and the cathode of the photodetection element 151, the photodetection element 151 is set to the Geiger mode. If photons are incident on the photodetection element 151 set to the Geiger mode, avalanche multiplication occurs, and a current flows through the photodetection element 151.

The quench circuit 153 includes, for example, an N-channel MOS transistor 156. The drain of the N-channel MOS transistor 156 is connected to the cathode of the photodetection element 151 and the input terminal of the input amplifier 154, and the source is grounded. If an external signal APDEN is input to the gate of the N-channel MOS transistor 156, a cathode voltage Vc is forcibly set to the ground potential. In this case, the photodetection function of the photodetection element 151 is deteriorated. Therefore, it is possible to avoid erroneous detection of an after-pulse in which avalanche multiplication occurs again even though no photon is incident on the photodetection element 151, or the like. Incidentally, the quench circuit 153 is not limited to the N-channel MOS transistor 156 as long as the cathode voltage Vc can be forcibly set to a potential that lowers the photodetection function of the photodetection element 151.

Incidentally, the source of the N-channel MOS transistor 156 may be connected to a negative potential instead of being grounded. In this case, there is a concern that the rise of the recharge (recovery) of the cathode voltage Vc becomes slower and the dead time becomes longer. However, as will be described later, in the present embodiment, the dead time can be shortened by optimizing the reference voltage of the input amplifier 154.

The input amplifier 154 compares the voltage of the input terminal, in other words, the cathode voltage Vc of the photodetection element 151, with a variable reference voltage. Furthermore, in the input amplifier 154, the voltage level of the output terminal changes according to the comparison result. The circuit configuration of the input amplifier 154 will be described later.

The state detecting circuit 155 detects the voltage level of the output terminal of the input amplifier 154 and sets the timing to change the potential of the reference voltage described above. The configuration of the state detecting circuit 155 will also be described later.

The signal processing circuit 143 includes a time to digital converter (TDC) 200, a histogram creating section 201, and a distance determining section 202. The time to digital converter (TDC) 200 converts an output signal of the input amplifier 154 into a digital value. Specifically, the TDC 200 digitally converts the occurrence time of the transition timing of the voltage level of the output terminal of the input amplifier 154.

The histogram creating section 201 counts the number of times the digital value described above is acquired, that is, the number of times the photodetection element 151 reacts.

The distance determining section 202 determines the distance from the photodetection element 151 to the subject 102, 103 on the basis of the count result of the histogram creating section 201. For example, the distance determining section 202 calculates an approximate curve for a normal distribution indicating the count result of the histogram creating section 201 (so-called Gaussian fitting), and obtains the distance by using the approximate curve.

Hereinafter, the circuit configuration of the input amplifier 154 will be described.

Figure 3A:
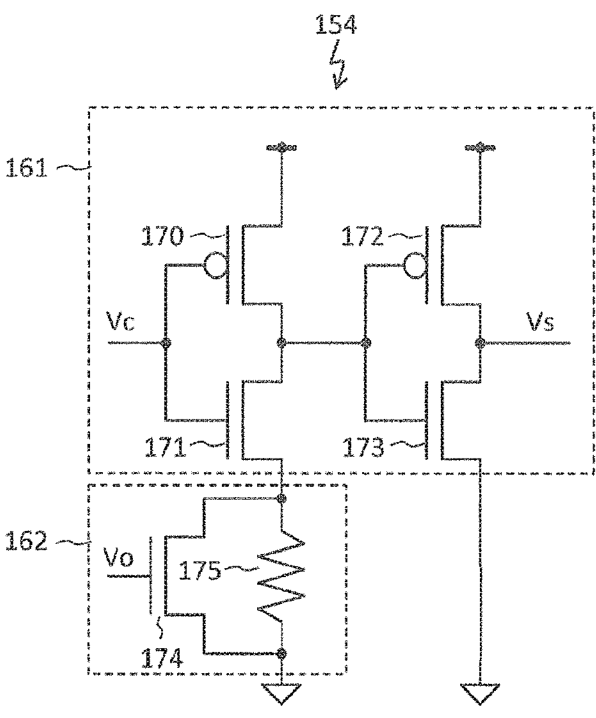
FIG. 3A is a circuit diagram depicting configuration of an input amplifier according to the first embodiment.

FIG. 3A is a circuit diagram depicting configuration of the input amplifier according to the present embodiment. The input amplifier 154 according to the present embodiment includes an inverter circuit 161 and a voltage control circuit 162 connected to the inverter circuit 161. The inverter circuit 161 corresponds to a comparison circuit.

The inverter circuit 161 includes MOS transistors 170 to 173. The MOS transistor 170 and the MOS transistor 172 are P-channel MOS transistors, and the MOS transistor 171 and the MOS transistor 173 are N-channel MOS transistors. The MOS transistor 170 and the MOS transistor 171 are connected in series. Furthermore, the MOS transistor 172 and the MOS transistor 173 are connected in series.

Each of the gates of the MOS transistor 170 and the MOS transistor 171 is an input terminal of the input amplifier 154. The cathode voltage Vc of the photodetection element 151 is input to each of the gates. The source of the MOS transistor 170 is connected to a positive power supply, and the source of the MOS transistor 171 is connected to the voltage control circuit 162. Each of the drains of the MOS transistor 170 and the MOS transistor 171 is connected to each of the gates of the MOS transistor 172 and the MOS transistor 173. The source of the MOS transistor 172 is connected to a positive power supply, and the source of the MOS transistor 171 is grounded. Each of the drains of the MOS transistor 172 and the MOS transistor 173 is an output terminal of the input amplifier 154, and is connected to the state detecting circuit 155 and the signal processing circuit 143.

The voltage control circuit 162 includes a switching element 174 and a resistive element 175. The switching element 174 is, for example, an N-channel MOS transistor. An output voltage Vo of the state detecting circuit 155 is input to the gate of the switching element 174. The drain is connected to the source of the MOS transistor 171. The source is grounded. In contrast, the resistive element 175 is connected in parallel to the switching element 174.

In the inverter circuit 161 configured as described above, one of the MOS transistor 170 or the MOS transistor 171 is turned on and the other is turned off according to the potential of the cathode voltage Vc of the photodetection element 151. If the MOS transistor 170 is turned on, the MOS transistor 173 is turned on, and the MOS transistor 172 is turned off. In this case, a voltage level Vs becomes a low level. If the MOS transistor 171 is turned on, the MOS transistor 172 is turned on, and the MOS transistor 173 is turned off. In this case, the voltage level Vs becomes a high level.

The threshold voltage for switching the voltage level Vs to the high level or the low level corresponds to the potential of the reference voltage. The potential of the reference voltage is changed by the voltage control circuit 162. If the switching element 174 of the voltage control circuit 162 is turned on, the potential of the reference voltage decreases. Conversely, if the switching element 174 is turned off, the potential of the reference voltage increases.

Figure 3B:
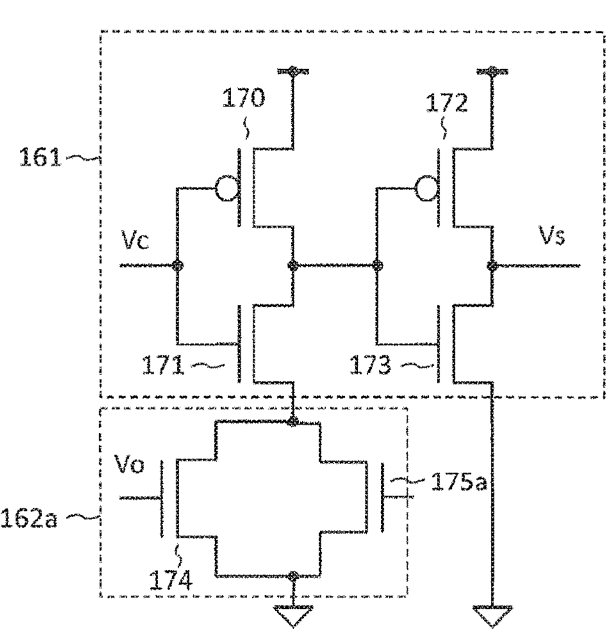
FIG. 3B is a circuit diagram depicting configuration of a first modification of the input amplifier.

FIG. 3B is a circuit diagram depicting configuration of a first modification of the input amplifier 154. Components similar to those of the input amplifier 154 illustrated in FIG. 3A are denoted by the same reference numerals, and a detailed description thereof will be omitted. An input amplifier 154 illustrated in FIG. 3B is different from the input amplifier 154 illustrated in FIG. 3A in the configuration of the voltage control circuit. Specifically, in a voltage control circuit **162*a* according to the present modification, a current source 175*a* is provided instead of the resistive element 175. The current source 175*a* is an N-channel MOS transistor. The drain of the N-channel MOS transistor is connected to the drain of the switching element 174, and the source is grounded. Furthermore, a reference voltage is input to the gate. This reference voltage is set such that the on-resistance of the switching element 174 is lower than the on-resistance of the current source 175***a*.

Figure 4:
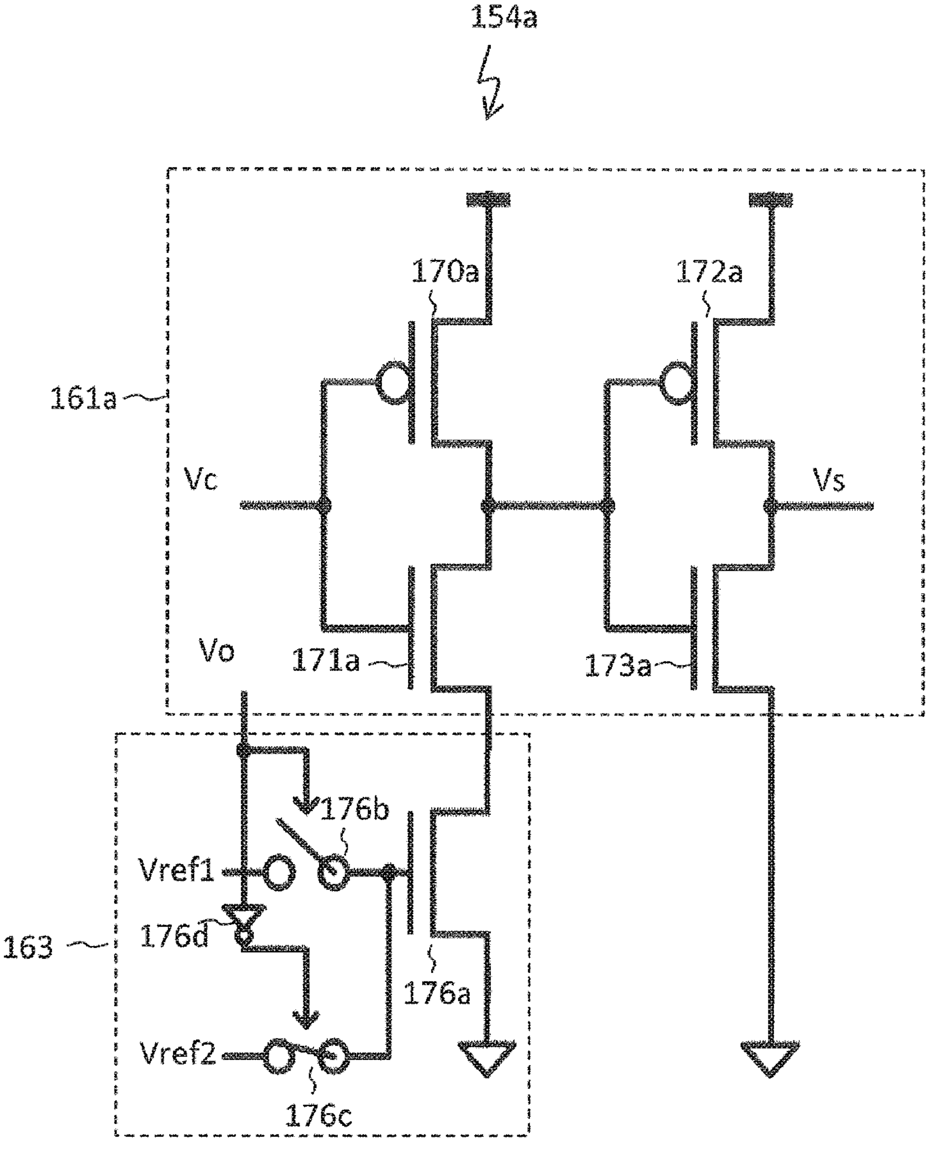
FIG. 4 is a circuit diagram depicting configuration of a second modification of the input amplifier.

FIG. 4 is a circuit diagram depicting configuration of a second modification of the input amplifier 154. An input amplifier 154*a* according to the present modification includes an inverter circuit 161*a* and a voltage control circuit 163 connected to the inverter circuit 161*a*. Similarly to the inverter circuit 161 depicted in FIG. 3A, the inverter circuit 161*a* includes MOS transistors 170*a* to 173*a*, and thus a detailed description thereof will be omitted.

In contrast, the voltage control circuit 163 includes a current source 176*a*, a switch 176*b*, a switch 176*c*, and an inverter element 176*d*. The current source 176*a* is an N-channel MOS transistor. The switch 176*b* and the switch 176*c* are connected in parallel with each other to the gate of the N-channel MOS transistor. The drain is connected to the source of the MOS transistor 171*a*. The source is grounded. The output current value of the current source 176*a* changes according to the gate voltage of the N-channel MOS transistor. If the gate voltage decreases, the output current value decreases, and therefore, the reference voltage for switching the voltage level Vs of the inverter circuit 161*a* increases. Conversely, if the gate voltage increases, the output current value increases, and therefore, the reference voltage decreases. The switch 176*b* and the switch 176*c* are turned on or off on the basis of the output voltage Vo of the state detecting circuit 155. A voltage obtained by inverting the potential of the output voltage Vo by the inverter element 176*d* is input to the switch 176*c*. Therefore, if one of the switch 176*b* or the switch 176*c* is turned on, the other is turned off. If the switch 176*b* is turned on, a first reference voltage Vref1 is supplied to the current source 176*a* as the gate voltage described above. Conversely, if the switch 176*c* is turned on, a second reference voltage Vref2 having a potential different from that of the first reference voltage Vref1 is supplied to the current source 176*a* as the gate voltage described above. Incidentally, the inverter element 176*d* may be provided on the switch 176*b* side instead of the switch 176*c* side.

Figure 5:
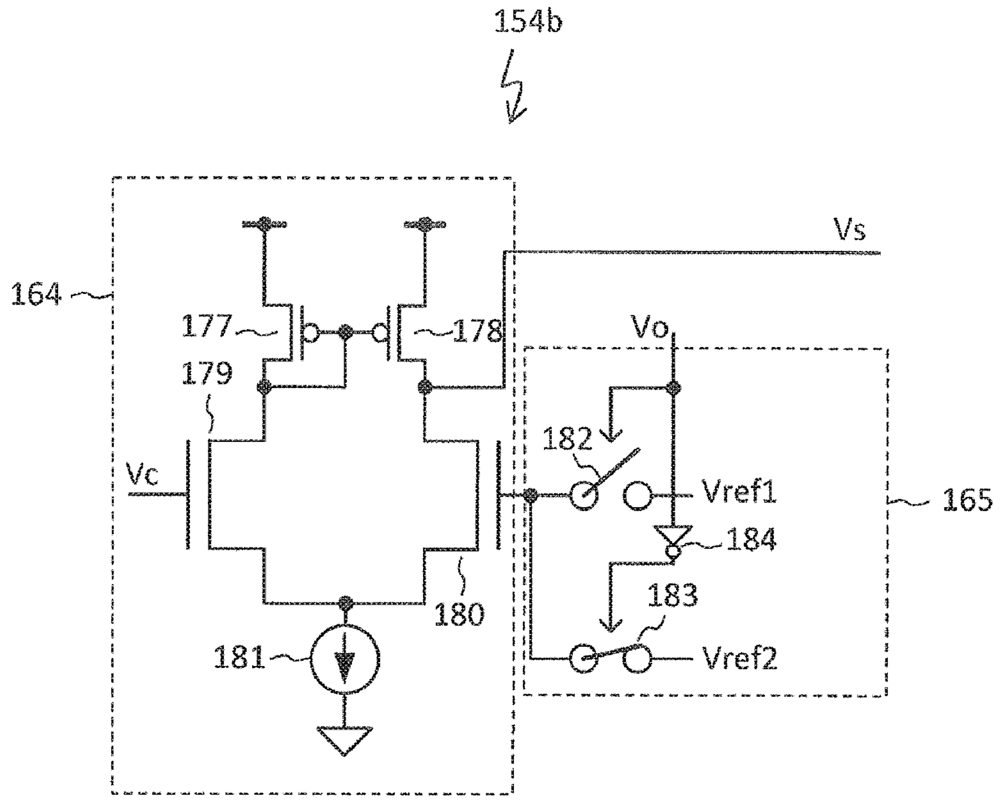
FIG. 5 is a circuit diagram depicting configuration of a third modification of the input amplifier.

FIG. 5 is a circuit diagram depicting configuration of a third modification of the input amplifier 154. An input amplifier 154*b* according to the present modification includes an operational amplifier circuit 164 and a switch circuit 165. The operational amplifier circuit 164 is an example of the comparison circuit and includes MOS transistors 177 to 180 and a current source 181. The MOS transistor 177 and the MOS transistor 178 are P-channel MOS transistors and constitute a current mirror circuit. The MOS transistor 179 and the MOS transistor 180 are N-channel MOS transistors having the same size and the same electrical characteristics, and are connected in parallel with each other via the current mirror circuit described above. The gate of the MOS transistor 179 is an input terminal of the input amplifier 154*b*. Furthermore, the drains of the MOS transistor 178 and the MOS transistor 180 are output terminals of the input amplifier 154*b*. The current source 181 is connected to each of the sources of the MOS transistor 179 and the MOS transistor 180.

The switch circuit 165 is a modification of the voltage control circuit 162, and includes a switch 182, a switch 183, and an inverter element 184. The switch 182 and the switch 183 are turned on or off on the basis of the output voltage Vo of the state detecting circuit 155. A voltage obtained by inverting the potential of the output voltage Vo by the inverter element 184 is input to the switch 183. Therefore, if one of the switch 182 or the switch 183 is turned on, the other is turned off. If the switch 182 is turned on, the first reference voltage Vref1 is input to the gate of the MOS transistor 180. Conversely, if the switch 183 is turned on, the second reference voltage Vref2 having a potential different from that of the first reference voltage Vref1 is input to the gate of the MOS transistor 180. Incidentally, the inverter element 184 may be provided on the switch 182 side instead of the switch 183 side.

Figure 6A:
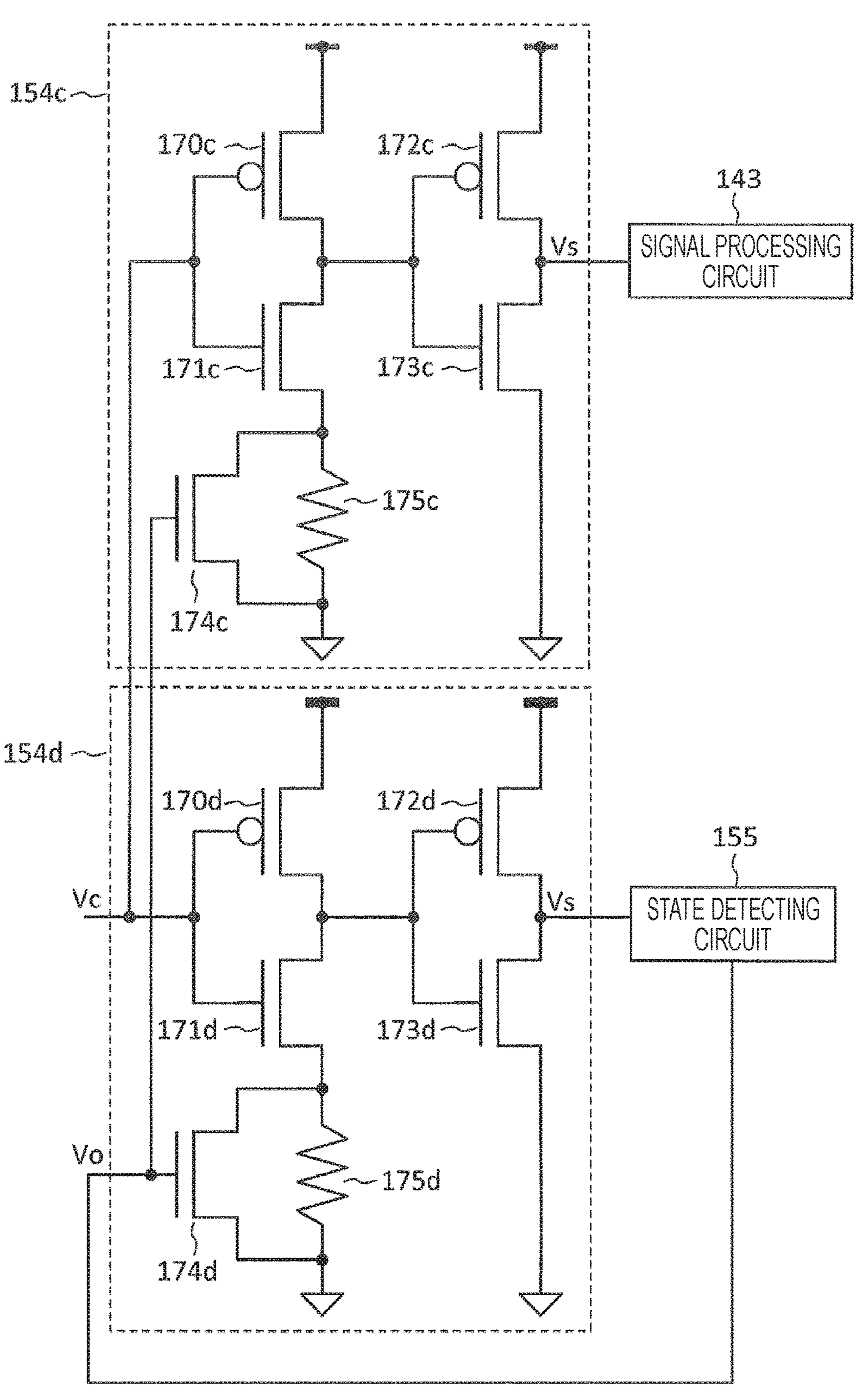
FIG. 6A is a circuit diagram depicting configuration of a fourth modification of the input amplifier.

FIG. 6A is a circuit diagram depicting configuration of a fourth modification of the input amplifier 154. The present modification includes a first input amplifier 154*c* and a second input amplifier 154*d*. Similarly to the input amplifier 154 illustrated in FIG. 3A, the first input amplifier 154*c* includes MOS transistors 170*c* to 173*c*, a switching element 174*c*, and a resistive element 175*c*. In the first input amplifier 154*c*, the gate of the MOS transistor 170*c* is an input terminal, and each of the drains of the MOS transistor 172*c* and the MOS transistor 173*c* is an output terminal. This output terminal is connected to the signal processing circuit 143.

In contrast, similarly to the input amplifier 154, the second input amplifier 154*d* also includes MOS transistors 170*d* to 173*d*, a switching element 174*d*, and a resistive element 175*d*. In the second input amplifier 154*d*, the gate of the MOS transistor 170*d* is an input terminal, and each of the drains of the MOS transistor 172*d* and the MOS transistor 173*d* is an output terminal. This output terminal is connected to the state detecting circuit 155.

Incidentally, in the present modification, the circuit configuration of the first input amplifier 154*c* is the same as the circuit configuration of the second input amplifier 154*d*, but may be different.

Figure 6B:
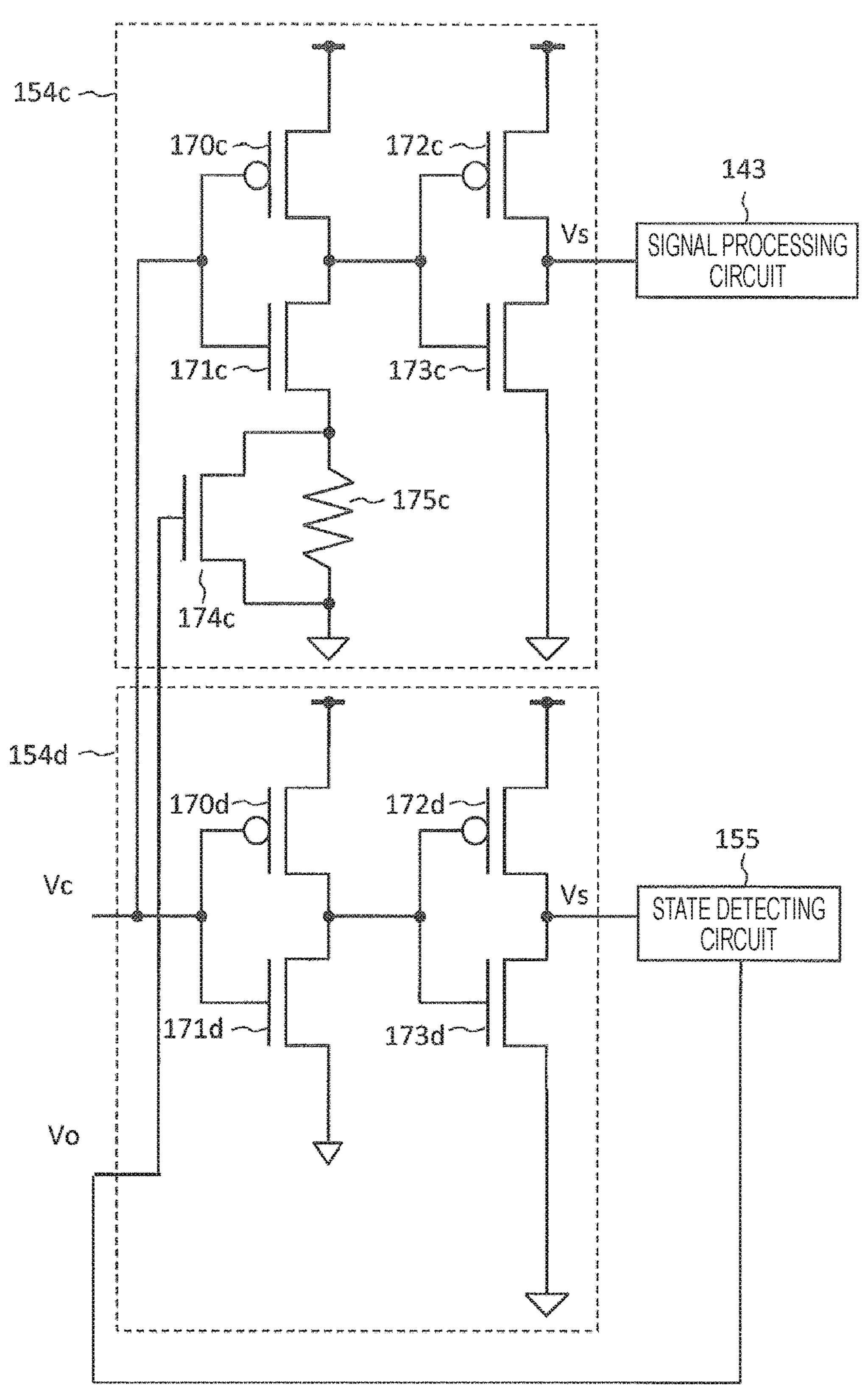
FIG. 6B is a circuit diagram depicting configuration of a fifth modification of the input amplifier.

FIG. 6B is a circuit diagram depicting configuration of a fifth modification of the input amplifier 154. Components similar to those in FIG. 6A are denoted by the same reference numerals, and a detailed description thereof will be omitted. In the present modification, configuration of the second input amplifier 154*d* is different from that of FIG. 6A. The second input amplifier 154*d* according to the present modification is not provided with the switching element 174*d* and the resistive element 175*d*, and the source of the MOS transistor 171*d* is grounded. That is, the second input amplifier 154*d* does not perform reference voltage control based on the output voltage Vo of the state detecting circuit 155. According to the present modification, since the cathode voltage Vc input during operation of the state detecting circuit 155 becomes constant, control is stabilized.

Hereinafter, circuit configuration of the state detecting circuit 155 will be described.

FIG. 7 is a circuit diagram depicting configuration of the state detecting circuit 155. The state detecting circuit 155 depicted in FIG. 7 can be applied to the input amplifier 154 depicted in FIGS. 3A and 3B, the input amplifier 154*b* depicted in FIG. 5, and the second input amplifier 154*d* depicted in FIGS. 6A and 6B. This state detecting circuit 155 includes five stages of inverter elements 190 connected in series with one another.

The state detecting circuit 155 described above outputs an input signal after a predetermined time has elapsed. The predetermined time corresponds to a delay time between the input signal and the output signal. This delay time can be set on the basis of the number of stages of the inverter elements 190. Therefore, the number of stages of the inverter elements 190 is not limited to five, and it is sufficient if the number is an odd number. By adjusting the number of stages of the inverter elements 190, the timing of changing the reference voltage of each input amplifier can be set.

FIG. 8 is a graph depicting an example of voltage characteristics of a plurality of photodetection elements 151. In the graph illustrated in FIG. 8, the horizontal axis represents time, and the vertical axis represents the cathode voltage Vc of the photodetection element. In a pixel array in which the plurality of photodetection elements 151 is two-dimensionally arranged, the drop characteristic of the cathode voltage Vc obtained when photons are incident on the photodetection element 151 is different between the photodetection elements in some cases due to variations in on-resistance and parasitic capacitance. In this case, as depicted in FIG. 8, if the reference voltage Vref of the input amplifier is fixed to a low value, the timing of detecting the drop of the cathode voltage Vc varies, which can be a factor of a distance measurement error. In order to reduce this distance measurement error, it is desirable to set the reference voltage Vref to a high value.

FIG. 9 is a graph depicting an example of voltage characteristics of a single photodetection element 151. Also in the graph illustrated in FIG. 9, the horizontal axis represents time, and the vertical axis represents the cathode voltage Vc of the photodetection element 151. If photons are incident on the photodetection element 151, avalanche multiplication occurs, and a current flows through the photodetection element 151. As a result, the cathode voltage Vc drops. If the avalanche multiplication converges, the cathode voltage Vc gradually recovers. In a dead time Tdead which is a period from when the cathode voltage Vc drops to when the cathode voltage Vc recovers, photons cannot be detected. Therefore, if the reference voltage Vref is fixed to a high value, the dead time Tdead becomes long, and the distance measuring performance can be insufficient. Therefore, in order to shorten the dead time Tdead, it is desirable to set the reference voltage Vref to a low value.

Figure 10:
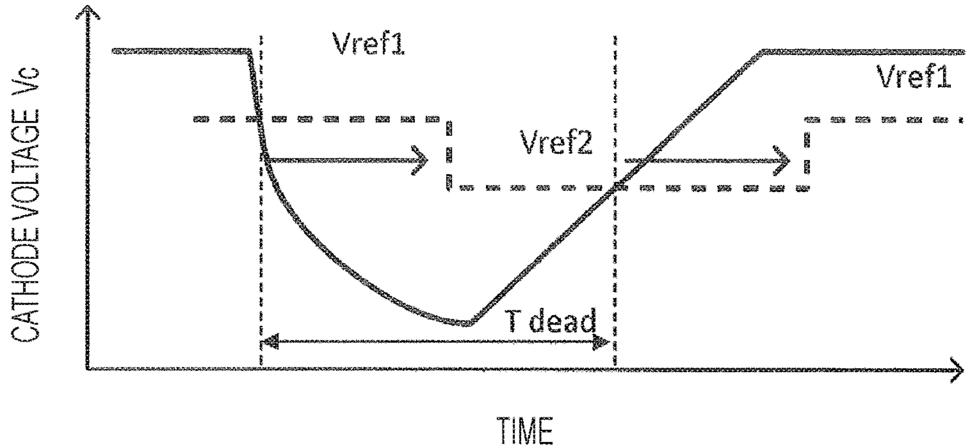
FIG. 10 is a graph depicting voltage characteristics of the photodetection element and reference voltage characteristics of the input amplifier.

FIG. 10 is a graph depicting voltage characteristics of the photodetection element 151 and reference voltage characteristics of the input amplifier 154. Also in the graph illustrated in FIG. 10, the horizontal axis represents time, and the vertical axis represents the cathode voltage Vc of the photodetection element 151.

In the input amplifier 154 according to the present embodiment, as described above, the voltage control circuit 162 can set two reference voltages. Furthermore, the state detecting circuit 155 can set a timing to switch between the two reference voltages. Therefore, as illustrated in FIG. 10, drop of the cathode voltage Vc can be detected at the first reference voltage Vref1 having a high potential, and recovery of the cathode voltage Vc can be detected at the second reference voltage Vref2 having a low potential. Incidentally, in the present embodiment, the timing at which the state detecting circuit 155 switches from the first reference voltage Vref1 to the second reference voltage Vref2 is matched with the timing from fall to rise of the cathode voltage Vc. Therefore, it is possible to more accurately measure drop and recovery of the cathode voltage Vc.

According to the present embodiment described above, since the reference voltage for detecting drop of the cathode voltage Vc of the photodetection element 151 can be set high, it is possible to reduce a distance measurement error due to variation in output timing among the plurality of photodetection elements 151. Furthermore, since the reference voltage for detecting recovery of the cathode voltage Vc can be set low, the dead time can be shortened. Therefore, since the two conflicting requirements of early detection of drop and recovery of the cathode voltage Vc can be satisfied, it is possible to improve the distance measuring performance.

(Modification)

Figure 11:
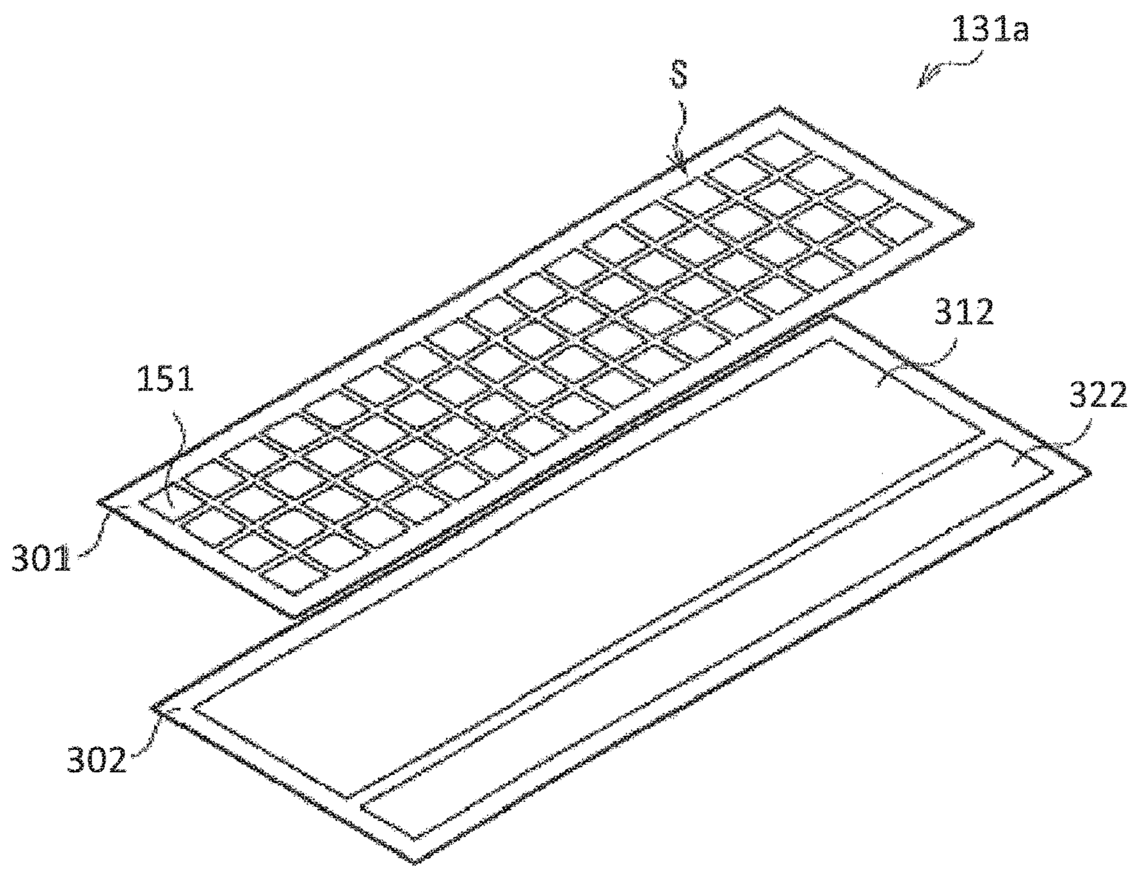
FIG. 11 is a perspective view depicting a structure of a distance measuring device according to a modification.

FIG. 11 is a perspective view depicting a structure of a distance measuring device according to a modification. Incidentally, components similar to those of the distance measuring device 131 according to the first embodiment described above are denoted by the same reference numerals, and detailed description thereof will be omitted.

A distance measuring device 131*a* depicted in FIG. 11 includes a first semiconductor substrate 301 and a second semiconductor substrate 302. The first semiconductor substrate 301 and the second semiconductor substrate 302 are bonded by, for example, a copper pad and are electrically connected.

On the first semiconductor substrate 301, a pixel array is formed by two-dimensionally arranging the plurality of photodetection elements 151. The surface on which the photodetection elements 151 are formed becomes a light receiving surface S of the distance measuring device 131*a*.

The second semiconductor substrate 302 has a region 312 facing the first semiconductor substrate 301 and a region 322 adjacent to the region 312. In the region 312, peripheral components of the photodetection element 151 in the photodetection circuit 142, that is, the charging circuit 152, the quench circuit 153, the input amplifier 154, and the state detecting circuit 155 are formed. In contrast, the signal processing circuit 143 is formed in the region 322.

Even in the structure of the present modification described above, similarly to the first embodiment, the reference voltage for detecting drop of the cathode voltage Vc of the photodetection element 151 and the reference voltage for detecting recovery of the cathode voltage Vc can be separately set. Therefore, the distance measuring performance can be improved.

Second Embodiment

Figure 12:
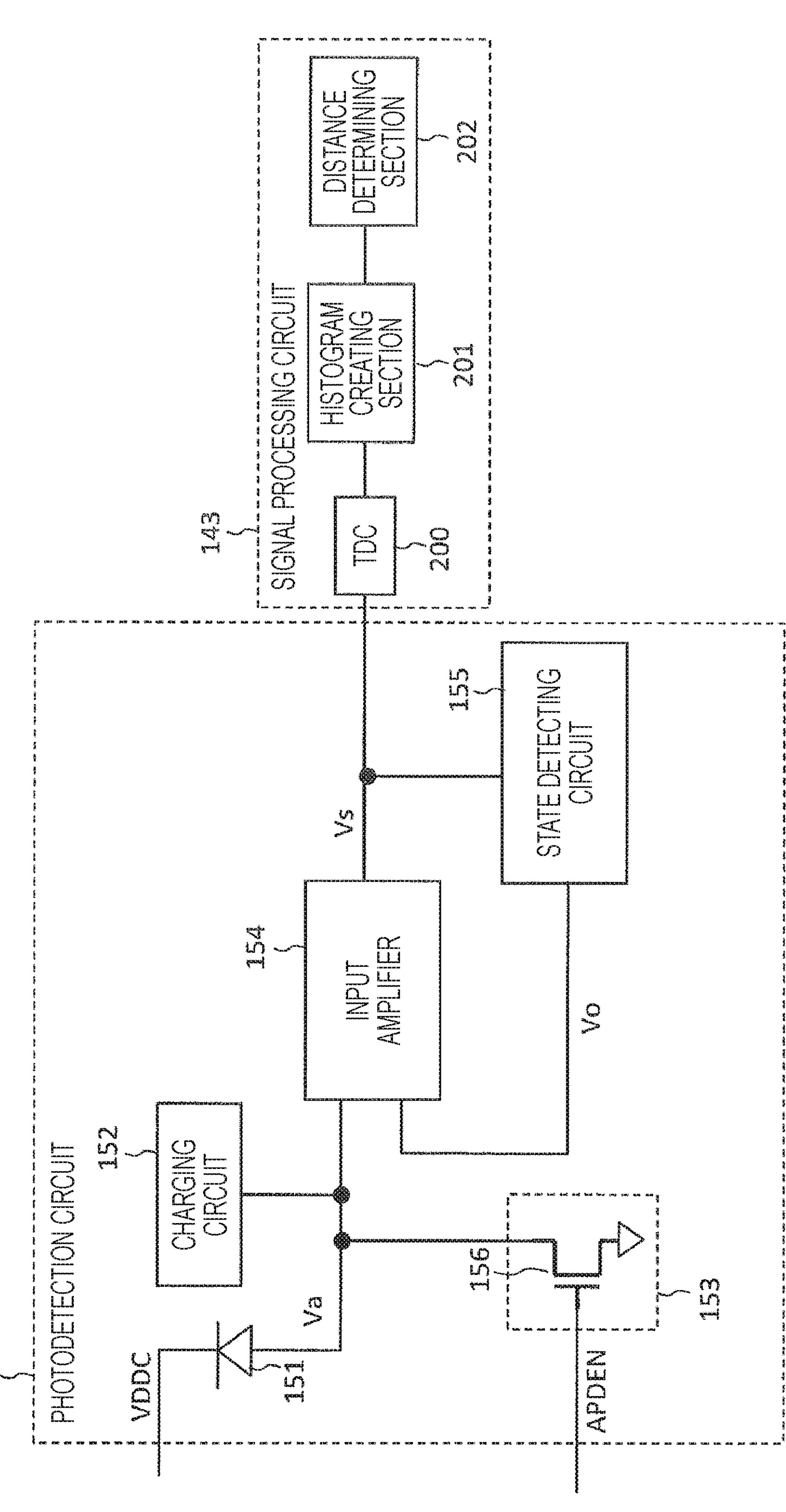
FIG. 12 is a block diagram depicting a configuration example of a distance measuring device according to a second embodiment.

FIG. 12 is a block diagram depicting a configuration example of a distance measuring device according to a second embodiment. Components similar to those of the distance measuring device 131 according to the first embodiment described above are denoted by the same reference numerals, and detailed description thereof will be omitted. The distance measuring device according to the present embodiment is different from that according to the first embodiment in configuration of a photodetection circuit. Hereinafter, the photodetection circuit according to the present embodiment will be described.

In a photodetection circuit 144 illustrated in FIG. 12, the anode of the photodetection element 151 is connected to the input terminal of the input amplifier 154, and the cathode is connected to a power supply. Therefore, the input amplifier 154 detects an increase and recovery of an anode voltage Va of the photodetection element 151 on the basis of the comparison between the anode voltage Va and the reference voltage. Since the circuit configuration of the input amplifier 154 is similar to that of the first embodiment, the reference voltage is switched on the basis of control of the state detecting circuit 155.

Figure 13:
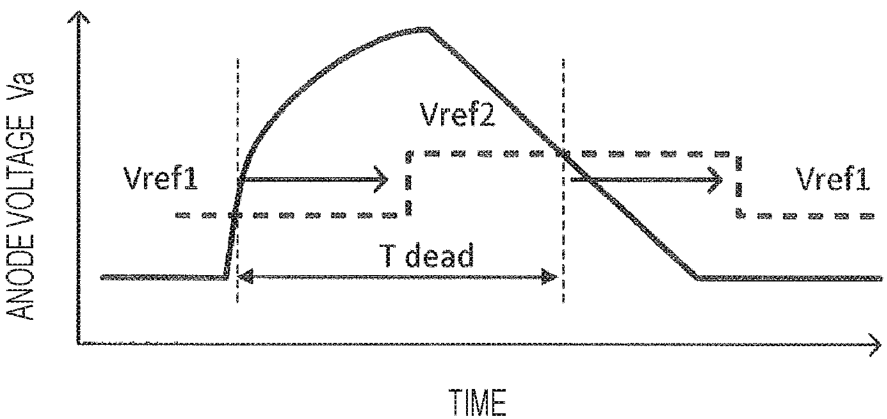
FIG. 13 is a graph depicting voltage characteristics of the photodetection element and reference voltage characteristics of the input amplifier.

FIG. 13 is a graph depicting voltage characteristics of the photodetection element 151 and reference voltage characteristics of the input amplifier 154. In the graph depicted in FIG. 13, the horizontal axis represents time, and the vertical axis represents the anode voltage Va of the photodetection element 151.

In the present embodiment, if photons are incident on the photodetection element 151, the anode voltage Va increases. Thereafter, the anode voltage Va gradually drops (recovers). At this time, in the input amplifier 154, the voltage control circuit 162 switches between the two reference voltages on the basis of control of the state detecting circuit 155. Therefore, as illustrated in FIG. 13, an increase in the anode voltage Va can be detected at the first reference voltage having a low potential, and a decrease in the anode voltage Va can be detected at the second reference voltage Vref2 having a high potential. Therefore, it is possible to reduce a distance measurement error due to variation in output timing among the plurality of photodetection elements 151 and to shorten the dead time Tdead.

According to the present embodiment described above, the reference voltage for detecting an increase in the anode voltage Va of the photodetection element 151 and the reference voltage for detecting a decrease in the anode voltage Va can be set separately. Therefore, the distance measuring performance can be improved.

<Example of Application to Mobile Body>

The technology according to the present disclosure (the present technology) can be applied to various products. For example, the technology according to the present disclosure may be realized as a device mounted on any type of a mobile body such as an automobile, an electric car, a hybrid electric car, a motorcycle, a bicycle, a personal mobility vehicle, an airplane, a drone, a ship, or a robot.

FIG. 14 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 14, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 14, an audio speaker 12061, a display section 12062, and an instrument panel 12063 are illustrated as the output device. The display section 12062 may, for example, include at least one of an on-board display and a head-up display.

Figure 15:
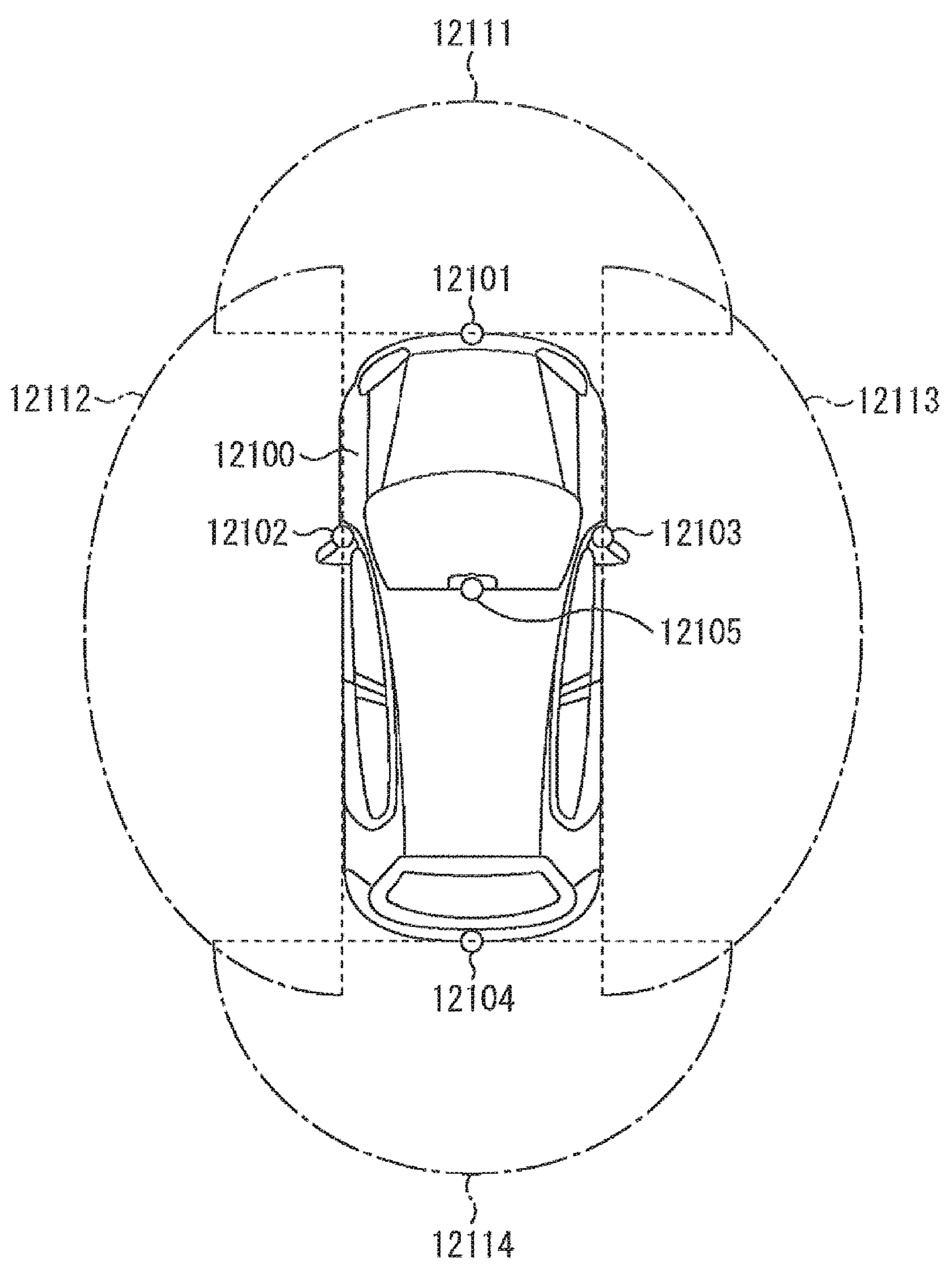
FIG. 15 is a diagram of assistance in explaining an example of installation positions of an outside-vehicle information detecting section and an imaging section.

FIG. 15 is a diagram depicting an example of the installation position of the imaging section 12031.

In FIG. 15, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 15 depicts an example of photographing ranges of the imaging sections 12101 to 12104. An imaging range 12111 represents the imaging range of the imaging section 12101 provided to the front nose. An imaging range 1211212113 respectively represents the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been described above. The technology according to the present disclosure can be applied to, for example, the imaging section 12031 in the configuration described above. Specifically, the distance measuring devices 131 and 131*a* can be applied to the imaging section 12031. By applying the technology according to the present disclosure, a captured image with higher distance measurement accuracy can be obtained, and therefore, safety can be improved.

Incidentally, the present technology can also be configured as follows.

(1) A photodetection circuit including:

an avalanche photodiode;

a charging circuit that supplies a voltage to the avalanche photodiode;

an input amplifier including a comparison circuit in which a voltage level of an output terminal changes according to a comparison result between a voltage of an input terminal connected to the avalanche photodiode and a reference voltage, and a voltage control circuit that changes a potential of the reference voltage; and a state detecting circuit that sets timing for causing the voltage control circuit to change the potential of the reference voltage on the basis of a detection result of the voltage level.

(2) The photodetection circuit according to (1), in which the comparison circuit includes an inverter circuit, and the voltage control circuit includes a switching element that is connected to the inverter circuit and performs switching according to an output voltage of the state detecting circuit, and a resistive element or a current source that is connected in parallel with the switching element.

(3) The photodetection circuit according to (1), in which the comparison circuit includes an operational amplifier circuit, and the voltage control circuit includes a switch circuit that switches the reference voltage to a first reference voltage or a second reference voltage different from the first reference voltage according to an output voltage of the state detecting circuit.

(4) The photodetection circuit according to (1), in which the comparison circuit includes an inverter circuit, and the voltage control circuit includes a current source that is connected to the inverter circuit and whose output current value changes according to an output voltage of the state detecting circuit.

(5) The photodetection circuit according to (2) or (3), in which the state detecting circuit includes inverter elements of odd-numbered stages connected in series with one another.

(6) The photodetection circuit according to any one of (1) to (5), in which the input amplifier includes a first input amplifier that outputs the comparison result to a signal processing circuit, and a second input amplifier that outputs the comparison result to the state detecting circuit.

(7) The photodetection circuit according to (6), in which circuit configuration of the first input amplifier is the same as circuit configuration of the second input amplifier.

(8) The photodetection circuit according to (6), in which circuit configuration of the first input amplifier is different from circuit configuration of the second input amplifier.

(9) The photodetection circuit according to any one of (1) to (8), in which the avalanche photodiode, the charging circuit, the input amplifier, and the state detecting circuit are provided on one semiconductor substrate.

(10) The photodetection circuit according to any one of (1) to (8), in which the avalanche photodiode is provided on a first semiconductor substrate, and the charging circuit, the input amplifier, and the state detecting circuit are provided on a second semiconductor substrate bonded to the first semiconductor substrate.

(11) The photodetection circuit according to any one of (1) to (10) further including a quench circuit that is connected to the avalanche photodiode and the input terminal of the input amplifier and controls a potential of the input terminal.

(12) The photodetection circuit according to any one of (1) to (11), in which a cathode of the avalanche photodiode is connected to the input terminal of the input amplifier.

(13) The photodetection circuit according to any one of (1) to (11), in which an anode of the avalanche photodiode is connected to the input terminal of the input amplifier.

(14) A distance measuring device including:

the photodetection circuit according to any one of (1) to (13); and a signal processing circuit that processes an output signal of the photodetection circuit.

(15) The distance measuring device according to (14), in which the signal processing circuit includes:

a time to digital converter (TDC) that converts the output signal into a digital value;

a histogram creating circuit that counts the number of times the digital value is acquired; and a distance determining section that determines a distance from the photodetection circuit to a subject on the basis of a count result of the histogram creating circuit.

REFERENCE SIGNS LIST

142 Photodetection circuit
143 Signal processing circuit
151 Photodetection element
152 Charging circuit
153 Quench circuit
154, 154*a*, 154*b* Input amplifier
154*c* First input amplifier
154*d* Second input amplifier
155 State detecting circuit
161, 161*a* Inverter circuit
162 Voltage control circuit
163 Voltage control circuit
164 Operational amplifier circuit
165 Switch circuit
174 Switching element
175 Resistive element
175*a* Current source
190 Inverter element
191 Operational amplifier
200 TDC
201 Histogram creating section
202 Distance determining section
301 First semiconductor substrate
302 Second semiconductor substrate

The invention claimed is:

1. A photodetection circuit, comprising:

an avalanche photodiode;

a charging circuit configured to supply a voltage to the avalanche photodiode;

an input amplifier including:

a comparison circuit configured to change a voltage level of an output terminal of the input amplifier based on a comparison result between a voltage of an input terminal of the input amplifier and a reference voltage, and a voltage control circuit configured to change a potential of the reference voltage, wherein the input terminal of the input amplifier is connected to the avalanche photodiode, the comparison circuit includes an inverter circuit, and the voltage control circuit includes:

a switching element connected to the inverter circuit, and one of a resistive element or a current source connected in parallel with the switching element; and a state detecting circuit configured to set, based on a detection result of the voltage level, a timing for the voltage control circuit, wherein the change of the potential of the reference voltage is based on the set timing, and the switching element is configured to execute a switching operation based on an output voltage of the state detecting circuit.

2. The photodetection circuit according to claim 1, wherein the voltage control circuit includes the current source connected to the inverter circuit, and an output current value of the current source changes based on the output voltage of the state detecting circuit.

3. The photodetection circuit according to claim 1, wherein the state detecting circuit includes inverter elements of odd-numbered stages, and the inverter elements are in a series connection in the state detecting circuit.

4. The photodetection circuit according to claim 1, wherein the avalanche photodiode, the charging circuit, the input amplifier, and the state detecting circuit are on a semiconductor substrate.

5. The photodetection circuit according to claim 1, wherein the avalanche photodiode is provided on a first semiconductor substrate, the charging circuit, the input amplifier, and the state detecting circuit are on a second semiconductor substrate, and the second semiconductor substrate is bonded to the first semiconductor substrate.

6. The photodetection circuit according to claim 1, further comprising a quench circuit connected to the avalanche photodiode and the input terminal of the input amplifier, wherein the quench circuit is configured to control a potential of the input terminal.

7. The photodetection circuit according to claim 1, wherein a cathode of the avalanche photodiode is connected to the input terminal of the input amplifier.

8. The photodetection circuit according to claim 1, wherein an anode of the avalanche photodiode is connected to the input terminal of the input amplifier.

9. A distance measuring device, comprising:

a photodetection circuit that includes:

an avalanche photodiode;

a charging circuit configured to supply a voltage to the avalanche photodiode;

an input amplifier including:

a comparison circuit configured to change a voltage level of an output terminal of the input amplifier based on a comparison result between a voltage of an input terminal of the input amplifier and a reference voltage, and a voltage control circuit configured to change a potential of the reference voltage, wherein the input terminal of the input amplifier is connected to the avalanche photodiode, the comparison circuit includes an inverter circuit, and the voltage control circuit includes:

a switching element connected to the inverter circuit, and one of a resistive element or a current source connected in parallel with the switching element; and a state detecting circuit configured to set, based on a detection result of the voltage level, a timing for the voltage control circuit, wherein the change of the potential of the reference voltage is based on the set timing, and the switching element is configured to execute a switching operation based on an output voltage of the state detecting circuit; and a signal processing circuit configured to process an output signal of the photodetection circuit.

10. The distance measuring device according to claim 9, wherein the signal processing circuit includes:

a time to digital converter (TDC) configured to convert the output signal into a digital value;

a histogram creating circuit configured to count a number of times of acquisition of the digital value; and a distance determining section configured to determine a distance from the photodetection circuit to a subject based on a count result of the histogram creating circuit.

11. A photodetection circuit, comprising:

an avalanche photodiode;

a charging circuit configured to supply a voltage to the avalanche photodiode;

an input amplifier including:

a comparison circuit configured to change a voltage level of an output terminal of the input amplifier based on a comparison result between a voltage of an input terminal of the input amplifier and a reference voltage, wherein the input terminal of the input amplifier is connected to the avalanche photodiode, and a voltage control circuit configured to change a potential of the reference voltage; and a state detecting circuit configured to set, based on a detection result of the voltage level, a timing for the voltage control circuit, wherein the change of the potential of the reference voltage is based on the set timing, and the input amplifier includes:

a first input amplifier configured to output the comparison result to a signal processing circuit, and a second input amplifier configured to output the comparison result to the state detecting circuit.

12. The photodetection circuit according to claim 11, wherein a circuit configuration of the first input amplifier is same as a circuit configuration of the second input amplifier.

13. The photodetection circuit according to claim 11, wherein a circuit configuration of the first input amplifier is different from a circuit configuration of the second input amplifier.

* * * * *